INDUCTANCELESS FM DISCRIMINATOR

Filed Feb. 6, 1961 2 Sheets-Sheet 1

WITNESSES
John E. Healy, Jr.
James F. Young

INVENTORS
Irving F. Barditch &
Raymond G. Hartenstein
BY R. J. Brodahl
ATTORNEY

United States Patent Office 3,086,175

Patented Apr. 16, 1963

3,086,175

INDUCTANCELESS FM DISCRIMINATOR

Irving F. Barditch, Baltimore, and Raymond G. Hartenstein, Ferndale, Md., assignors to Westinghouse Electric Corporation, East Pittsburgh, Pa., a corporation of Pennsylvania Filed Feb. 6, 1961, Ser. No. 87,352
5 Claims. (Cl. 329—132)

The present invention relates to discriminator circuits for use within frequency modulated receivers, and more particularly to discriminator circuit which do not require the utilization of inductors within the circuitry.

Discriminator circuits commonly used within FM (frequency modulated) receivers require a transformer with its primary winding tuned to the IF (intermediate frequency), and a center tapped secondary winding. The secondary winding may be separately tuned across the center tap to the maximum deviation frequency from the rest frequency of the FM signal, or the entire secondary may be tuned to the IF frequency as in the Foster-Seeley discriminator and ratio detector circuits. In each of these circuits, physical inductors, such as the windings of a transformer, are required to tune the discriminators. Solid state circuits in monolithic or molecular block from are not at present readily adaptable to provide an inductive characteristic.

It is therefore an object of the present invention to provide an improved FM discriminator that does not require physical inductors.

It is a further object of the present invention to provide an improved FM discriminator which does not require physical inductors by utilizing a pair of inductanceless transistor tuned amplifiers.

Other objects and improvements will become more apparent from the following description and drawings, in which.

The present invention broadly provides a pair of tuned amplifiers which may be in monolithic or molecular block form, which are tuned to the two maximum deviation frequencies lying symmetrically about the center frequency of a FM signal, which signal is applied to the amplifiers. The FM signal is applied directly to each amplifier and because of the operative association of their outputs it is not necessary to have a limiter in the inputs to the amplifiers. Automatic gain biasing control means is provided for each amplifier. The output of the respective tuned amplifiers are connected in opposing amplitude comparing relation to thereby provide an output signal which is indicative of the information on the input FM signal.

Figure 1:
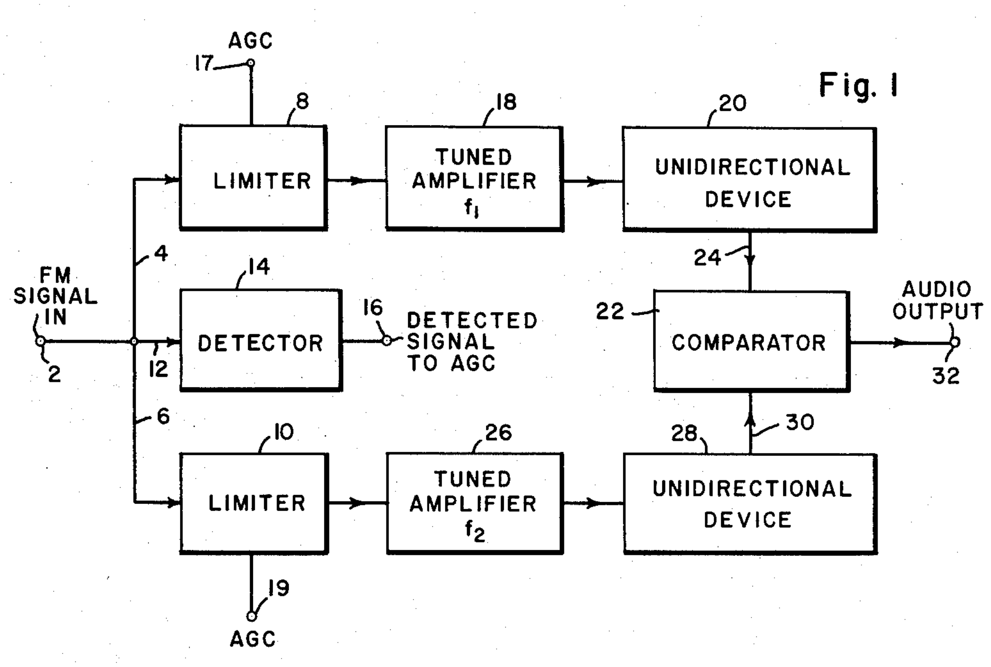
FIGURE 1 shows a block diagram of the discriminator circuit as taught in accordance with the present invention.

Referring to FIGURE 1, an FM signal, which may be at an intermediate frequency, is applied at terminal 2. The FM signal is taken from terminal 2 and applied to leads 4 and 6 to the limiters 8 and 10, respectively. The input signal is also applied through lead 12 to the detector 14. The detector 14 provides an output detector signal at terminal 16 to control the gain of the limiters 8 and 10. Suitable amplifying means (not shown) may be required for the detected signal to provide gain control to the limiter 8 through the input terminal 17 and to the limiter 10 through input terminal 19. The output of the limiter 8 is applied to the tuned amplifier 18, which may be a transistor tuned amplifier, which does not require an inductance to be tuned. The tuned amplifier

18 is tuned to the frequency $f_1$, which is the maximum deviation frequency of the input FM signal from its center frequency $f_0$, on the low frequency side. The output of the tuned amplifier 18 is applied to the unidirectional device 20, whose output in turn is applied to the comparator 22 through input lead 24. The output of the limiter 10 is applied to the tuned amplifier 26, which is tuned to the maximum deviation frequency of the input FM signal $F_2$ on the high frequency side. The output of the tuned amplifier 26 is applied to the unidirectional device 28, whose unidirectional output is in turn applied through input lead 30 of comparator 22. The comparator 22 takes the difference of its input signals applied to leads 24 and 30 to provide a difference output signal at terminal 32 which is indicative of the audio information of the input FM signal.

The amplifiers 18 and 26 are preferably of the type described and claimed in copending applications by Irving F. Barditch and Robert Bento, entitled "Semiconductor Amplifier and Oscillator Circuit," Serial Number 122,457, filed July 7, 1961, or copending application by Irving F. Barditch, Robert Bento and William Freeman entitled "Low Insertion Loss Unilateralization Structure," Serial Number 89,499, filed February 15, 1961, and assigned to the assignee of this application.

Figure 2:
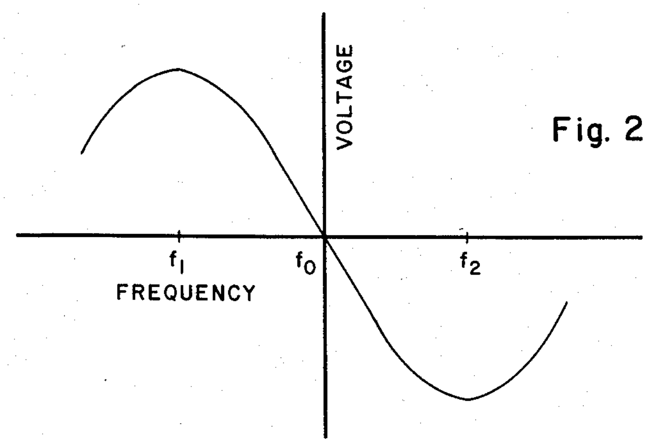
FIGURE 2 is a plot of the voltage output of discriminator circuit versus frequency.

The operation of the discriminator of FIGURE 1 will also be explained with reference to FIGURE 2. The FM input signal has a center frequency $f_0$ and maximum deviation frequencies of $f_1$ and $f_2$. The FM input signal is amplitude clipped in the limiters 8 and 10, which are responsive to the detected signals from the detector 14 being applied to the limiter through input terminals 17 and 19 respectively. The tuned amplifier 18 is tuned to its resonant frequency $f_1$ to provide its maximum amplitude at the frequency $f_1$ and lesser amplitude signals at frequencies varying from $f_1$ according to a normal resonant frequency curve characteristic. Thus the output signal from the tuned amplifier 18, which is applied to the unidirectional device 20, will be indicative of the input signal deviation from the frequency $f_1$. The tuned amplifier 26, which is tuned to the frequency $f_2$, provides an output being indicative of the deviation of the input signal from its resonant frequency $f_2$; this output signal is applied to the unidirectional device 28. The rectified outputs of the unidirectional devices 20 and 28 are applied to the comparator 22 which takes the algebraic sum of its input signals at leads 24 and 30 to provide an audio output signal at terminal 32. The output at terminal 32 is a function of frequency as shown in FIGURE 2. This output is then indicative of the audio information present on the input FM signal.

Figure 3:
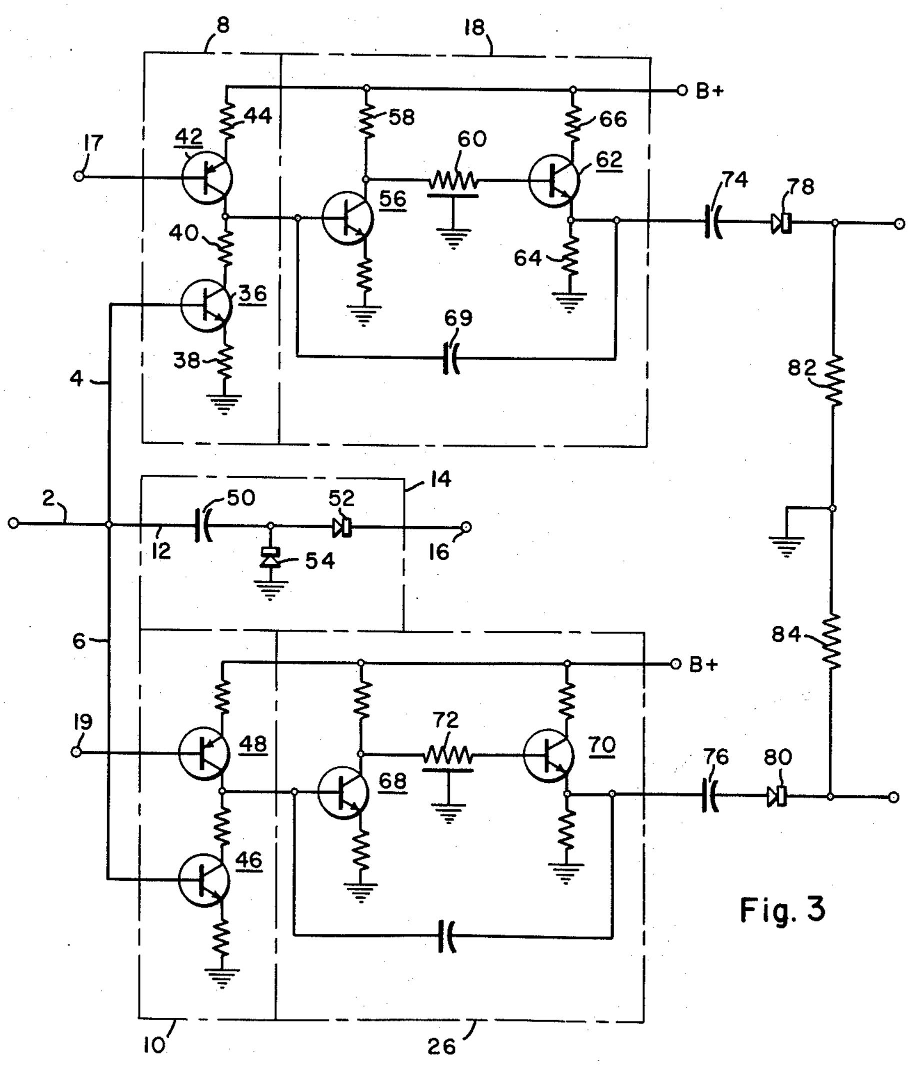
FIGURE 3 is a schematic diagram of the specific embodiment of the discriminator of the present invention.

A specific embodiment of the discriminator, shown in block form in FIGURE 1, is shown in FIGURE 3. The limiter 8 includes the transistor 36, which has its emitter connected to ground through the resistor 38 and its collector connected through the resistor 40 to the collector terminal of the transistor 42. The emitter of transistor 42 is connected through the resistor 44 to B+. The input FM signal is applied to the base terminal of transistor 36 through lead 4. The limiter 10 is substantially identical to the limiter 8 including transistors 46 and 48. The input FM signal is applied to the base terminal of transistor 46 through lead 6. The detector 14 includes the capacitor 50 to which the input is supplied to one terminal and to the other terminal is connected the diode 52 with the anode terminal toward the capacitor 50. The cathode of diode 52 is connected to the detected signal output terminal 16. To the anode terminal of diode 52 is also connected the diode 54 with its cathode toward the anode of diode 52 and its anode connected to ground. The detected output signals from terminal 16 of the detector 14 is applied to the input terminals 17 and 19 of the limiters 8 and 10, respectively through suitable connecting means, not shown. The tuned amplifier 18 includes the transistor 56, which receives the output of the limiter 8 through its base terminal. The collector of the transistor 56 is connected through resistor 58 to B+, and the collector is also connected to the R-C filter 60, which may be any well known distributed parameter R-C filter network, or delay device described in the aforementioned copending applications, to provide the necessary phase shift to provide a positive feedback of the desired band of frequencies. The filter 60 is also connected to the base of transistor 62 which has its emitter connected through resistor 64 to ground. The emitter of the transistor 62 is connected to the base of the transistor 56 through feedback capacitor 69. The collector of the transistor 62 is connected to B+ through resistor 66. The tuned amplifier 26 is substantially identical to the tuned amplifier 18 having the transistors 68 and 70 and a R-C filter 72. The outputs from the tuned amplifiers 18 and 26 are taken from the emitter of the transistors 62 and 70, respectively, and applied to the coupling capacitors 74 and 76, which are also connected to the diodes 78 and 80 with the anodes of the diodes toward the capacitors. The cathodes of the diodes 78 and 80 are then applied across the comparator circuit 22, which includes the grounded center tap resistive network including resistors 82 and 84.

The operation of the discriminator shown in FIGURE 3 is the same as that of FIGURE 1, with the tuned amplifiers being tuned to the maximum deviation frequencies $f_1$ and $f_2$ of the input FM signal, the limiters 8 and 10 limiting the signal to a predetermined amplitude level, and the detector 14 providing the gain control to the limiter and the output of the amplifiers being rectified and then compared across the resistive comparative circuit 22 to provide the audio output. It is to be noted that no physical inductors appear in the transistor tuned amplifiers 18 or 26 and also that no inductors appear in any of the input circuitry.

Although the present invention has been described with a certain degree of particularity, it should be understood that the present disclosure has been made only by way of example and that numerous changes in the details of construction and the combination and arrangement of elements may be resorted to without departing from the scope and the spirit of the present invention.

We claim as our invention:

1. A discriminator circuit operative within a frequency modulated receiver and including signal input means to receive frequency modulated signals, a pair of limiting means to commonly receive said frequency modulated signals and being operative to amplitude gain control said frequency modulated signals, detecting means to receive said frequency modulating signals and being operative to gain control said limiting means, a pair of transistor tuned amplifiers to commonly receive said gain controlled signals from said limiting means and being each tuned respectively to the different maximum deviation frequencies from the rest frequency of said frequency modulated signals, a pair of unidirectional devices to separately receive the outputs of each of said tuned amplifiers and being operative to provide unidirectional output signals indicative of the output of said tuned amplifiers, and comparing means to receive said unidirectional signals and being operative to provide an output indicative of the amplitude difference between said unidirectional signals.

2. A frequency discriminator circuit comprising input signal means upon which a frequency modulated signal is adapted to be impressed, a pair of parallel signal translation channels having their inputs connected to said input means and having their outputs connected in opposing voltage comparing relation to thereby provide an output which is a function of the output voltages of said channels, each of said signal translation channels having automatic gain control means, rectifying means connected to said input signal means for developing a biasing voltage for said automatic gain control means, a band pass tuned amplifier in each of said respective channels and each being tuned to frequencies spaced a selected amount on opposite respective sides of the center frequency of the frequency modulated signal impressed upon said input signal means.

3. A frequency discriminator circuit comprising, input signal means upon which a frequency modulated signal is adapted to be impressed, a pair of parallel signal translation channels having their inputs connected to said input means and having their outputs connected in opposing voltage comparing relation to thereby provide an output which is a function of the output voltages of said channels, each of said signal translation channels having automatic gain control means, rectifying means connected to said input signal means for developing a biasing voltage for said automatic gain control means, a band pass tuned amplifier in each of said respective channels and each being tuned to frequencies spaced a selected amount on opposite respective sides of the center frequency of the frequency modulated signal impressed upon said input signal means, the outputs of said channels each having a unilateral device.

4. A frequency discriminator circuit configuration adapted to be built into a self-contained monolithic block comprising, input circuit means on which FM signals are adapted to be impressed, a pair of signal translation channels having their inputs connected to said input means and having their outputs connected in opposing voltage comparing relation to thereby provide an output which is a function of the input voltages of said channels, each of said channels having AGC means, each of said channels comprising an amplifier connected to said input means, a first transistor signal translation means in one channel tuned to the maximum frequency excursion from the carrier frequency on one side thereof, a second transistor signal translation means in the other channel tuned to the maximum frequency excursion on the other side of the carrier frequency, rectifying means connected to said input signal means for developing a biasing voltage for said AGC means, whereby the signal level in each channel is automatically maintained so that the algebraic sum of the output voltages of said signal translation channels is a function of the FM modulation of said input signal.

5. As a new article of manufacture a frequency discriminator incorporated into a self-contained monolithic block comprising input circuit means upon which FM signals are adapted to be impressed, a pair of signal translation channels having their inputs connected to said input means, each of said channels having AGC means, each of said channels comprising a configuration in said monolithic block constituting a semiconductor amplifier connected to said input means, a first transistor signal translation means in one of said channels tuned to the maximum excursion frequency on one side of the center frequency of the carrier, a second signal translation means in the other channel tuned to the maximum excursion frequency on the other side of said carrier, the tuning of the signal translation means in both of said channels being effected by regenerative feedback of the selected band of frequencies extending from the center frequency to the maximum excursion frequencies on opposite sides of said carrier, rectifying means connected to said input signal means for developing a biasing voltage for said AGC means, the outputs of said transistor signal translation devices being connected in opposing voltage comparing relation to thereby provide an output which is a function of the ratio of the output voltages of said channels, whereby the AGC means of each signal channel is effected from semiconductor configurations within said monolithic block and the summing of the output voltages of said signal translation devices is a function of the modulation on the FM signal and independent of the amplitude of the input signal.

References Cited in the file of this patent

UNITED STATES PATENTS

| | | |
|---|---|---|
| Re. 24,407 | Christensen | Dec. 17, 1957 |
| 2,835,802 | Day | May 20, 1958 |
| 2,907,932 | Patchell | Oct. 6, 1959 |
| 2,961,613 | Eschner | Nov. 22, 1960 |

FOREIGN PATENTS

| | | |
|---|---|---|
| 459,723 | Great Britain | Jan. 13, 1937 |